US008115106B2

(12) United States Patent
Tanaka et al.

(10) Patent No.: US 8,115,106 B2
(45) Date of Patent: Feb. 14, 2012

(54) SURFACE MOUNT DEVICE

(75) Inventors: Minoru Tanaka, Tokyo (JP); Seishi Watanabe, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 598 days.

(21) Appl. No.: 12/323,468

(22) Filed: Nov. 25, 2008

(65) Prior Publication Data
US 2009/0145647 A1 Jun. 11, 2009

(30) Foreign Application Priority Data
Nov. 26, 2007 (JP) .................. 2007-304630

(51) Int. Cl.
*H05K 1/18* (2006.01)
(52) U.S. Cl. ......... 174/260; 361/767; 257/782; 257/783
(58) Field of Classification Search .......... None
See application file for complete search history.

(56) References Cited

U.S. PATENT DOCUMENTS

| 7,534,663 B2 * | 5/2009 | Ogawa et al. ............ 438/127 |
| 2006/0103302 A1 * | 5/2006 | Tanaka et al. ............ 313/512 |
| 2007/0178629 A1 | 8/2007 | Ogawa et al. | |

FOREIGN PATENT DOCUMENTS

| JP | 10-050734 | * | 2/1998 |
| JP | 11046018 | | 2/1999 |
| JP | 2007207921 | | 8/2007 |

* cited by examiner

*Primary Examiner* — Gregory Thompson
(74) *Attorney, Agent, or Firm* — Kenealy Vaidya LLP

(57) ABSTRACT

The disclosed subject matter includes a surface mount electronic device with high reliability and favorable optical characteristics. The surface mount electronic device can include a circuit board with at least one conductor pattern formed on an insulating board and an electronic component that is mounted on a die bonding pad located on the at least one conductor pattern with an adhesive material. The die bonding pad can include a plurality of cutout sections that expose the insulating board and extend towards a center from a circumference thereof. Therefore, the adhesive material can adhere to both the die bonding pad and the insulating board exposed in the plurality of cutout sections along with the electronic component. In this case, the plurality of cutout sections can be formed so as not to drag the adhesive material upwards on each of the side surfaces of the electronic component. Thus, the surface mount electronic device can improve reliability thereof while maintaining predetermined optical characteristics.

23 Claims, 6 Drawing Sheets

7

SURFACE MOUNT DEVICE

This application claims the priority benefit under 35 U.S.C. §119 of Japanese Patent Application No. 2007-304630 filed on Nov. 26, 2007, which is hereby incorporated in its entirety by reference.

BACKGROUND

1. Field

The presently disclosed subject matter relates to surface mount devices including LEDs, laser diodes, etc., and more particularly to a surface mount device with high reliability in which an electronic component can be reliably mounted on the die bonding pad by fixing it on both a die bonding pad and an insulating board exposed in a plurality of cutout sections with an adhesive material.

2. Description of the Related Art

Surface mount devices are frequently used for an electronic device such as a mobile phone, a personal computer and the like because they are small, light and can be directly mounted along with other electronic parts on a mounting board in a reflow soldering process.

However, surface mount devices should maintain high reliability so as not to break even when exposed to high temperature such as the environment present during a soldering process. The electronic device may become inoperable even if only one surface mount device breaks The broken device is difficult to replace because it is directly mounted along with the other electronic parts on the mounting board.

A conventional surface mount LED device is disclosed in Patent Document No. 1 (Japanese Patent Application Laid Open H11-046018). And also a conventional manufacturing method for surface mount devices is disclosed in Patent Document No. 2 (Japanese Patent Application Laid Open JP2007-207921).

FIG. 6 is a perspective view depicting a conventional surface mount LED device disclosed in Patent Document No. 1. The surface mount LED device includes: a circuit board that is made by forming conductor patterns 12 on surfaces of an insulating board 11; an LED chip 13 that is mounted on a die bonding pad 12a of the conductor patterns 12 via a conductive adhesive 14; and a bonding wire 15 for connecting an upper electrode of the LED chip 13 to a wire bonding pad 12b of the conductor patterns 12.

In addition, the surface mount LED device includes an encapsulating resin 16 that encapsulates both the LED chip 13 and the bonding wire 15 on the circuit board. Thus, the encapsulating resin 16 can prevent both the LED chip 13 and the bonding wire 15 from some problems caused by vibration, shock, dampness, etc, and can improve reliability of the surface mount LED device.

Furthermore, Patent Document No. 2 discloses and further characterizes the encapsulating resin 16. The encapsulating resin 16 can be composed of at least one of a transparent resin and a mixture resin, and the mixture resin includes a resin mixed with at least one of a diffuser, a phosphor, and a pigment for selectively absorbing light having a predetermined wavelength.

Therefore, the surface mount LED device can emit a direct light emitted from the LED chip 13 to the outside via the encapsulating resin 16 and also can emit a wavelength-converted light such as a white light and the like via the encapsulating resin 16.

However, the conventional surface mount LED device shown in FIG. 6 might cause a problem such as the LED 13 may not emit a light. One reason is that the conductor patterns 12 might peel from the encapsulating resin 16 and the LED chip 13 might peel from the die bonding pad 12a of the conductor patterns 12 along with the encapsulating resin 16.

The above-described problem may be caused after a reflow soldering process when mounting the surface mount LED devices on a mounting board and the like in the electronic devices. During the period when the devices are left in a high temperature environment, such as during the soldering reflow process, a difference of thermal expansion coefficient between the conductor patterns 12 and the encapsulating resin 16 might cause the above-described problems.

The surface mount LED device made according to the method disclosed in Patent document No. 2 may also cause a problem in that the LED device may have small variations with respect to the predetermined optical characteristics. The principal reason is that the conductive adhesive 14 may be drug upwards onto side surfaces of LED chip 3 that is located on a die bonding pad in a die bonding process and may be solidified on the side surfaces of LED chips 3.

Therefore, the solidified conductive adhesive 14 on the side surfaces of LED chip 3 might cause the above-described variations in optical characteristics. This is especially true when the LED device emits the wavelength-converted light to the outside via the encapsulating resin 16 of the mixture resin. In some cases, the conductive adhesive 14 on the side surfaces of LED chip 3 may cause a problem such as a non-uniform light distribution and the like.

The above-referenced Patent Documents are listed below, and are hereby incorporated with their English abstracts in their entireties.

1. Patent Document No. 1: Japanese Patent Application Laid Open H11-046018; and

Patent Document No. 2: Japanese Patent Application Laid Open JP2007-207921. The disclosed subject matter has been devised to consider the above and other problems features and characteristics. Thus, an embodiment of the disclosed subject matter can include a surface mount electronic device that can exhibit improved reliability by preventing various problems associated with exposure to high temperature such as during reflow soldering process, while reducing other associated problems of the conventional devices.

SUMMARY OF THE DISCLOSED SUBJECT MATTER

The presently disclosed subject matter has been devised in view of the above and other problems features and characteristics and to make certain changes to the conventional devices. An aspect of the disclosed subject matter includes providing various surface mount devices with high reliability, in which an electronic component can be firmly fixed on both a die bonding pad and an insulating board exposed in a plurality of cutout sections with an adhesive material, and can be mounted on the die bonding pad. Another aspect of the disclosed subject matter includes providing various surface mount electronic devices, in which variability of optical characteristics caused by a die bonding process can be extremely reduced while avoiding electrical defects.

According to an aspect of the disclosed subject matter, a surface mount device can include a circuit board including conductor patterns formed on an insulating board based on a resin, and the conductor patterns can include both a die bonding pad and at least one wire bonding pad that each extend and are configured to connect to electrodes thereof for receiving a power supply. The die bonding pad can include both a center and a circumference and also can include a plurality of cutout sections that expose the insulating board towards the center from the circumference.

The surface mount device can also include an electronic component having both a bottom surface and a center of a bottom surface that are mounted on the die bonding pad with the adhesive material based on a resin. Electrodes of the electronic component can be electrically connected to each electrode of the conductor patterns through the die bonding pad with the adhesive material and/or the at least one wire bonding pad with at least one bonding wire, wherein the adhesive material can be configured to contact the insulating board exposed in the plurality of cutout sections that are located out of the electronic component mounted on the die bonding pad.

In the above-described exemplary surface mount device, each of the cutout sections can be substantially symmetrical with respect to at least one of the other cutout sections and with respect to a line intersecting the center of the die bonding pad and with respect to a line intersecting at a right angle with the center of the bottom surface of the electronic component.

In addition, an outline of each of the cutout sections can be configured with a curve line. Each of the insulating board and the adhesive material can also be configured with a material based on an epoxy resin.

In the above-described exemplary surface mount device, the device can further include an overcoat configured to enclose the die bonding pad on the circuit board in order to control the adhesive area contacting the adhesive material with both the die bonding pad and the insulating board including the plurality of cutout sections. And also the device can further include an encapsulating resin located so as to encapsulate the electronic component on the circuit board.

According to the above-described exemplary surface mount device, because the adhesive material for mounting the electronic component on the die bonding pad can optimally adhere to both the die bonding pad and the insulating board of the circuit board without a bubble entrainment therein, the surface mount device can maintain high reliability while emitting a preferable light.

Another of the aspects of the disclosed subject matter includes a surface mount device that can include a circuit board forming conductor patterns on an insulating board based on a resin, and the conductor patterns can include both a die bonding pad and at least one wire bonding pad that extend to electrodes thereof for receiving a power supply. The die bonding pad can include both a center and a circumference and also can include a plurality of cutout sections that exposes the insulating board towards the center from the circumference and locates substantially symmetrical with respect to two lines intersecting at a right angle to each other at the center.

In addition, the device can include a light-emitting component that is substantially cubic or rectangular parallelepiped having a bottom surface and a center of a bottom surface, and the light-emitting component can be mounted on the die bonding pad with the adhesive material that is based on a resin. The center of the bottom surface of the light-emitting component can substantially correspond to the center of the die bonding pad and each side of the bottom surface thereof can intersect at a right angle with one of the two lines so as to be located parallel to the other of the two lines, and electrodes thereof can be electrically connected to each electrode of the conductor patterns through the die bonding pad with the adhesive material and/or the at least one wire bonding pad with at least one bonding wire, wherein the adhesive material can be configured to contact the plurality of cutout sections that are located out of the light-emitting component mounted on the die bonding pad.

In the immediately above-described surface mount device, the same or similar variations of the device can be employed as set forth in paragraphs [0020] and [0021].

The above-described surface mount device can maintain higher reliability, because the light-emitting component can adhere firmly to the die bonding pad with an even intensity in all circumferences of the light-emitting component via the adhesive material. Furthermore, the device can extremely reduce the variability of optical characteristics caused by a die bonding process, because the adhesive material cannot drag upwards on the side surfaces of light-emitting component.

BRIEF DESCRIPTION OF THE DRAWINGS

These and other characteristics and features of the disclosed subject matter will become clear from the following description with reference to the accompanying drawings, wherein.

DETAILED DESCRIPTION OF EXEMPLARY EMBODIMENTS

Figure 1:
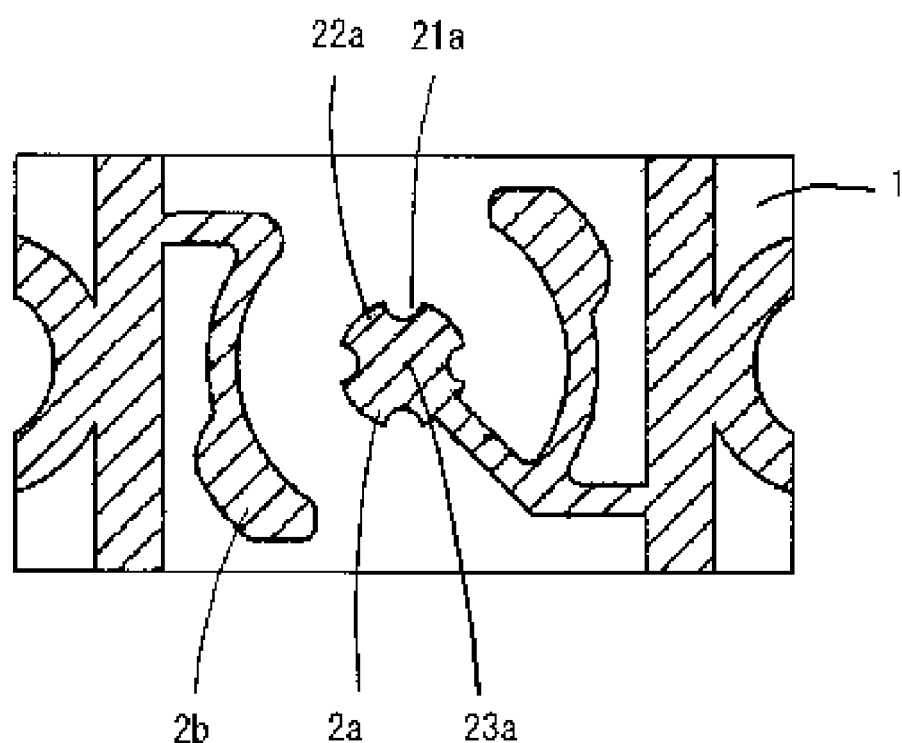
FIG. 1 is a top view showing a first exemplary embodiment of a circuit board for a surface mount device made in accordance with principles of the disclosed subject matter.
Figure 2:
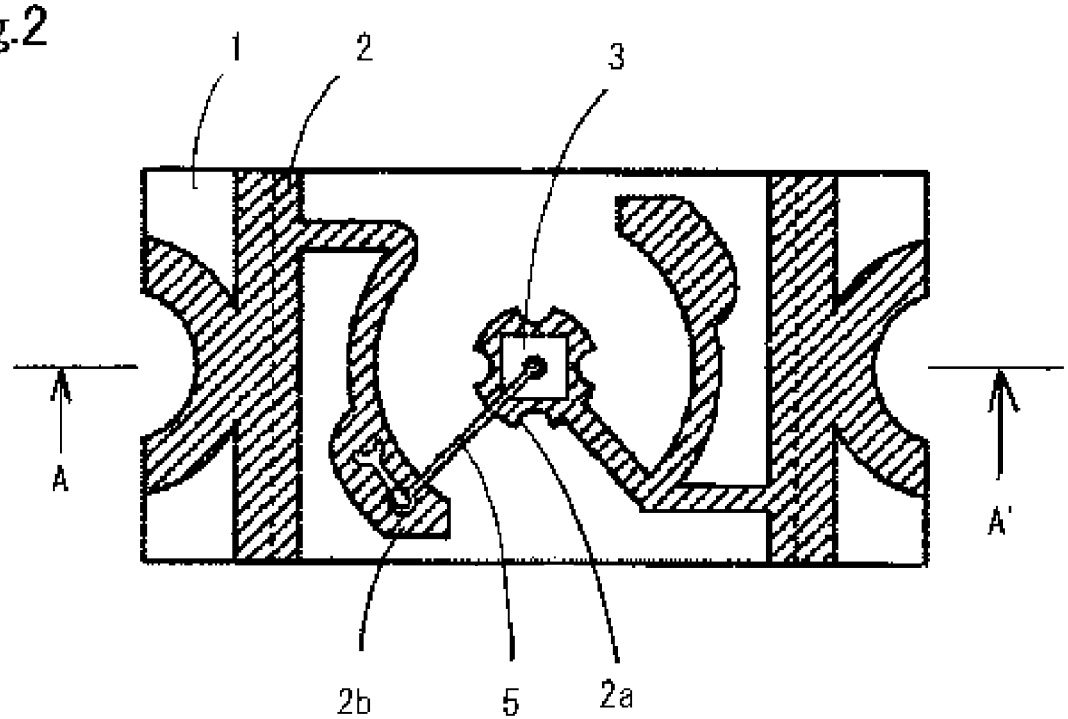
FIG. 2 is a partial top view of a surface mount LED device made in accordance with the exemplary embodiment of FIG. 1.

A first exemplary embodiment of the disclosed subject matter will now be described in detail with reference to FIGS. 1-3. FIG. 1 is a top view showing a circuit board of a first exemplary embodiment of a surface mount device in accordance with the disclosed subject matter. FIG. 2 is a partial top view of a surface mount LED device made in accordance with the first exemplary embodiment of the disclosed subject matter and FIGS. 3(A) and (B) are partial cross-section views taken along line A-A shown in FIG. 2 of exemplary surface mount LED devices.

In order to ease the understanding of the first exemplary embodiment, a description of exemplary surface mount LED devices of the disclosed subject matter will now be given with reference to FIGS. 3(A) and (B). Each of surface mount LED devices 10 shown in FIGS. 3(A) and (B) can include a circuit board that can be made by forming conductor patterns 2 on surfaces of an insulating board 1 based on a resin. The circuit board can be provided with an LED chip 3 located on and attached to a die bonding pad 2a of the conductor patterns 2 via an adhesive material 4.

Electrodes of the LED chip 3 can be electrically connected to electrodes 2c of the conductor patterns 2 and therefore the LED chip 3 can emit light by receiving a power supply via the electrodes 2c of the conductor patterns 2. The above-described surface mount LED device 10 can be used as a light source for an electronic device such as an indicator, which may not be exposed to vibration, shock, etc. and can be attached to a casing of the indicator and the like in order to prevent exposure to dust, moisture, etc.

Figure 3A:
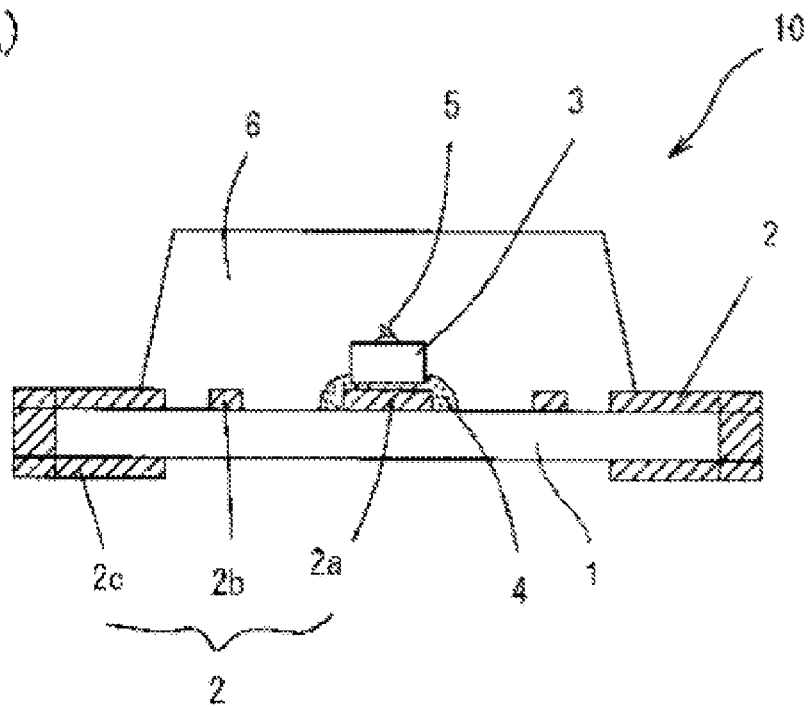
FIGS. 3(A) and (B) are partial cross-section views taken along line A-A shown in FIG. 2 showing two exemplary surface mount LED devices.

When the LED device 10 is used for electronic devices that may be exposed to vibration, shock, dust, etc., such as a mobile phone and the like, the electronic devices can employ the surface mount LED device 10 in which the LED chip 3 is encapsulated with an encapsulating resin 6 as shown in FIG. 3(A). In some electronic devices, the surface mount LED device 10 can include a lens 8 on the circuit board, as show in FIG. 3(B).

In the above-described exemplary surface mount LED devices, the insulating board 1 can be made from various materials based on a resin including, for instance, glass epoxy, paper epoxy, paper phenol, etc. The thickness of the insulating board 1 can be between substantially 0.03 mm and substantially 0.3 mm. The conductor patterns 2 can be composed of metal layers (e.g. Cu/Ni/Au) and the thickness thereof can be substantially 0.03 mm.

The conductor patterns 2 can include both a die bonding pad 2a and a wire bonding pad 2b located on the insulating board 1 as shown in FIGS. 1 and 2. Therefore, the conductor patterns 2 can provide two electrodes 2c of cathode and anode. The electrodes 2c of the conductor patterns 2 can extend from both the die bonding pad 2a and the wire bonding pad 2b via both sides of the insulating board 1.

Finally, the electrodes 2c of the conductor patterns 2 can be formed on a bottom surface opposite a top surface of the circuit board on which is provided the LED chip 3 on the die bonding pad 2a, as shown in FIGS. 3(A) and (B). Thus, the surface mount LED device 10 can be mounted on a mounting board of electronic devices such mobile phones and the like via the electrodes 2c of the conductor patterns 2 in a reflow soldering process.

However, each of the electrodes 2c of the conductor patterns 2 can also be formed on the same top surface to both the die bonding pad 2a and the wire bonding pad 2b when mounting the surface mount LED device 10 on a top surface of the mounting board of the electronic devices. Similarly, each of the two electrodes 2c of the conductor patterns 2 can also be formed on both sides of the insulating board 1 in some cases.

The LED chip 3 can be substantially rectangular and parallelepiped having both top and bottom surfaces and a center axis and can include a pair of electrodes, one on each of the top and bottom surfaces thereof. The bottom electrode on the bottom surface can be electrically connected to the die bonding pad 2a of the conductor patterns 2 via the adhesive material 4 which includes a conductive material (e.g., silver Ag). The upper electrode on the top surface can be electrically connected to the wire bonding pad 2b of the conductor patterns 2 via a bonding wire 5 that can be composed of a gold (Au) wire.

The die bonding pad 2a can be formed, for example, as a circular structure, and can include circumference of a plurality of cutout sections 21a exposed to the insulating board 1 and indented towards a center 23a of the circular structure from a circumference of the circle as shown in FIG. 1. Each of the cutout sections 21a can enable the adhesive material 4 to easily contact the insulating board 1 because the insulating board 1 is exposed therein. Thus, the LED chip 3 can be attached to the die bonding pad 2a via the adhesive material 4 and also can be firmly attached to the insulating board 1 that is exposed in the plurality of cutout sections 21a via the adhesive material 4 when mounting the LED chip 3 on the die bonding pad 2a.

In this case, each of the cutout sections 21a can be configured to form a concave indent toward the center 23a of the circle of the die bonding pad 2a, and the concave indent can be configured with a curved line. The curved line can prevent the adhesive material 4 from causing a bubble entrainment therein in each of the cutout sections 21a as described in detail later.

In addition, the die bonding pad 2a can include a plurality of flange sections 22a extending outwards from the center 23a as shown in FIG. 1. In a top view of the circuit board, for instance, each of the flange sections 22a can be located in a direction towards a corner from a center of the bottom surface of LED chip 3 mounted on the die bonding pad 2, on which the center is a point at the intersection of both diagonal lines of the bottom surface of the LED chip 3.

Thus, the bonding pad 2a can effectively radiate heat generated from the LED chip 3 with the plurality of flange sections 22a. In addition, because four side surfaces of the LED chip 3 can be easily located to face towards the plurality of cutout sections 22a, the bonding pad 2a can effectively prevent the adhesive material 4 from climbing upwards on each of the side surfaces of the LED chips 3.

In the above-describe structure, each of the cutout sections 21a are not formed underneath the bottom electrode that forms the bottom surface of the LED chip 3. That is to say, the plurality of cutout sections 21a can be formed out of the range of the bottom surface of the LED chip 3.

The conductive patterns 2 can be configured to form a thin and small area in order to prevent peeling thereof on the insulating board 1. The reason is that peeling between the conductive patterns 2 and the insulating board 1 may be caused by a difference between their coefficients of thermal expansion, especially during the period when the surface mount LED device is left in a high temperature such as occurs during the reflow soldering process.

However, if each of the cutout sections 21a extends underneath the bottom surface of the LED chip 3 mounted on the die bonding pad 2a, the cutout sections 21a may cause bubble entrainment in the adhesive material 4 and also may cause an extreme decrease of radiation efficiency due to a decrease of contact area to the bonding pad 2a.

When the adhesive material 4 includes bubbles therein, an expansion of the bubbles may cause a decrease of adhesive intensity in a high temperature setting such as a reflow soldering process and the like. Thus, the surface mount LED device including bubble entrainment may decrease reliability thereof. In addition, the decrease of radiation efficiency may cause a debasement of optical characteristics of the LED chip 3 due to an increase of temperature in the p-n junction thereof.

Therefore, the surface mount LED device 10 can have high reliability and can also prevent the adhesive material 4 from generating a bubble entrainment therein by locating each of the cutout sections 21a out of the range of the bottom surface of LED chip 3 which is mounted on the bonding pad 2a.

In the above-described exemplary embodiment, the plurality of cutout sections 21a can be formed symmetrically with respect to at least one line intersecting at the center 23a of the die bonding pad 2a as viewed from a top position. In this case, because thermal stress generated by a difference between coefficients of thermal expansion of the material does not generate a slant between the materials, the adhesive material 4 can adhere to both the die bonding pad 2a and the insulating board 1 exposed in the plurality of the cutout sections 21a with an even intensity while enabling the mounting of the LED chip 3 on the die bonding pad 2a.

Furthermore, the plurality of cutout sections 21a can be located symmetrically with respect to two lines intersecting at a right angle to each other at the center 23a of the die bonding pad 2a as viewed from a top position, and the LED chip 3 can be mounted on the die bonding pad 2a so that the center axis of the bottom surface the LED chip 3 substantially corresponds to the center 23a of the die bonding pad 2a and so that each side of the bottom surface of the LED chip 3 intersects at a right angle with one of the two lines while being parallel to the other of the two lines.

More specifically, for instance, each of the cutout sections 21a can be formed by an arc, such as a circle having a diameter of 0.07 mm. The center of each arc can be located at a point at the intersection of the two central axis lines (extending from the center of the bottom surface of the LED chip 3 to each center of the four sides of the bottom surface) and the circumference of a circle defined by the outermost portions of flange sections 22a the circle can have a 0.235 mm diameter.

In the above-described exemplary embodiment, when each maximum width of the cutout sections 21a are formed to be between one-eighth and one-sixth of the maximum width of the die bonding pad 2a, the die bonding pad 2a can become small. In addition, a favorable adhesive area for the adhesive material 4 can be maintained.

In this case, the plurality of cutout sections 21a can be formed symmetrically with respect to the two central axis lines intersecting at a right angle to each other at the center 23a of the die bonding pad 2a and corresponding to the center of the bottom surface of the LED chip 3. Therefore, because the plurality of cutout sections 21a can be located symmetrically with respect to the center of the bottom surface of the LED chip 3 in a top view thereof, the LED chip 3 can adhere firmly to the die bonding pad 2a with an even intensity in all circumferences of the LED chip 3 via the adhesive material 4. The adhesive material 4 can also adhere firmly to the insulating board 1 exposed in the plurality of cutout sections 21a while preventing both bubble entrainment therein and dragging of adhesive upwards on each of the side surfaces of the LED chips 3.

The above-described LED chip 3 can include, for instance, a square chip of around 0.06 mm length on a side in a top view thereof. In this case, each width of the cutout sections 21a can be approximately 0.07 mm in diameter of the circles and each length thereof can be nearly equal to 0.035 mm in radius of the circle. A distance from each side surface of the LED chip 3 to each of the closest circumference of the cutout sections 21a towards the center 23a of die bonding pad 2a can be around 0.02 mm, and can become shorter than each width of the cutout sections 21a. Consequently, the adhesive material 4 for mounting the LED chip 3 on the die bonding pad 2a can easily reach the insulating board 1 exposed in each of the cutout sections 21a.

The adhesive material 4 can be filled in a continuous manner on both the die bonding pad 2a and all the cutout sections 21a exposed to the insulating board 1, and can contact at least the cutout sections 21a on the insulating board 1. Thus, the adhesive area created by both the insulating board 1 that is made by a resin having a high adhesion and the adhesive material 4 which cab also be made from a resin can increase reliability of the surface mount device.

In this exemplary case, when the insulating board 1 is made by a glass epoxy and the adhesive material 4 is composed of an epoxy resin having properties that are close to that of the insulating board 1, the adhesive intensity between the LED chip 3 and the circuit board, including both the die bonding pad 2a and the insulating board 1, can further increase.

The encapsulating resin 6 shown in FIG. 3(A) can be composed of at least one of a transparent resin and a mixture resin, and the mixture resin can include a resin mixed with at least one of a diffuser, a phosphor, and a pigment for selectively absorbing light having a predetermined wavelength. An epoxy resin or a silicon resin, etc., can be used for the transparent resin.

Therefore, the surface mount LED device 10 shown in FIG. 3(A) can emit direct light emitted from the LED chip 3 to the outside, and also can emit wavelength-converted light of various color to the outside via the encapsulating resin 6 of the mixture resin. In addition, the device 10 can prevent the encapsulating resin 6 from experiencing problems caused by external factors such as a vibration, shock, dust, dampness, etc.

Figure 3B:
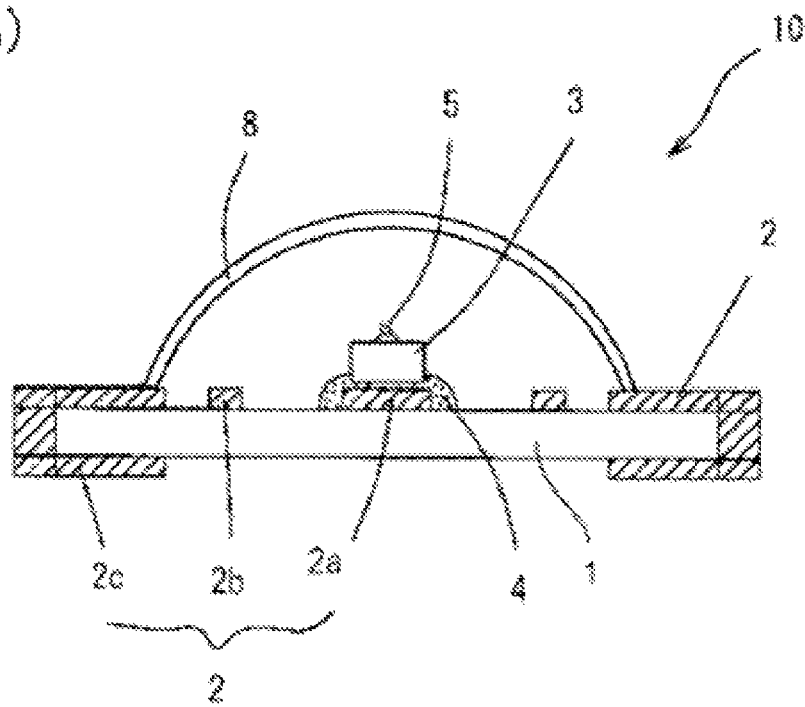

The lens 8 shown in FIG. 3(B) can be made from glass, resin, and the like, and the lens 8 can also include the above-described mixture resin. Thus, the surface mount LED device 10 shown in FIG. 3(B) can provide the same operations as those of the device shown in FIG. 3(A), and can also provide various light distributions via the lens 8 by changing a shape of lens 8.

Furthermore, when the devices 10 shown in FIGS. 3(A) and (B) are used as light receiving devices, both the encapsulating resin 6 and the lens 8 can be used for receiving light with the electronic component 3. That is to say, at least one of the encapsulating resin 6 and the lens 8 can carry out an operation for controlling light emitted from the electronic component, including wavelength converting, and also can carry out an operation for receiving light with the electronic component.

According to the surface mount LED device of the disclosed subject matter as described above, the LED chip 3 can be firmly mounted on the die bonding pad 2a with even intensity via the adhesive material 4 and without both the bubble entrainment and/or dragging of the material 4 on the side surfaces thereof. Thus, the presently described exemplary LED device does not cause problems such as peeling of the LED chip 3 from the die bonding pad 2a and/or peeling of the conductor patterns 2 from the encapsulating resin 6 even when the encapsulating resin 6 is located on the circuit board so as to cover the LED chip 3.

Moreover, the LED device can include the bonding pad 2a that can effectively prevent the adhesive material 4 from dragging upwards on each of the side surfaces of the LED chips 3 using the plurality of cutout sections 21a thereof. Thus, the LED device can reduce the variability of optical characteristics caused by a die bonding process, even if the encapsulating resin 8 encapsulates the LED chip 3 on the circuit board and the wavelength of light emitted from the LED chip 3 is converted with the mixture resin.

In the above-described first exemplary embodiment, a shape of the die bonding pad 2a is described with reference to a circle having a center. However, the shape should not be limited to a circle. The die bonding pad 2a can be various other appropriate shapes, such as an ellipse, a quadrangle, etc. In addition, the die bonding pad 2a can also be shaped without a center by determining an appropriate substitute center therein, and also can be formed in a shape with a center. The center can move if the plurality of cutout sections 21a is not located underneath the bottom surface of the electric component mounted on the die bonding pad 2a, and the center of bottom surface of the electric component can substantially correspond to the center.

In this case, the plurality of cutout sections 21a may not be located symmetrically with respect to any lines intersecting at the center. However, the plurality of cutout sections 21a may include a symmetrical shape formed in an outward direction from the closest circumference thereof towards the center with respect to at least one line intersecting at the center.

When the plurality of cutout sections 21a include a symmetrical shape formed in an outward direction from the closest circumference thereof towards the center 23a of die bonding pad 23a with respect to at least one line intersecting at a right angle with the center bottom surface of the electric component, the surface mount device can enjoy the above-described efficiency.

Thus, each of the cutout sections 21a should not be limited to the above-described arc of circle, and can form a voluntary shape if the plurality of cutout sections 21a are not located underneath the bottom surface of the electric component mounted on the die bonding pad 2a. In addition, a distance from the center 23a of die bonding pad 2a to each circumference of the cutout sections 21a towards the center 23 a should not be limited. Therefore, a voluntary distance can be contemplated according to various shapes, characteristics, usages and the like of both the surface mount device and an electronic component, if the adhesive material 4 can adhere to both the die bonding pad 2a and the insulating board 1 exposed in the plurality of cutout sections 21a.

Figure 4:
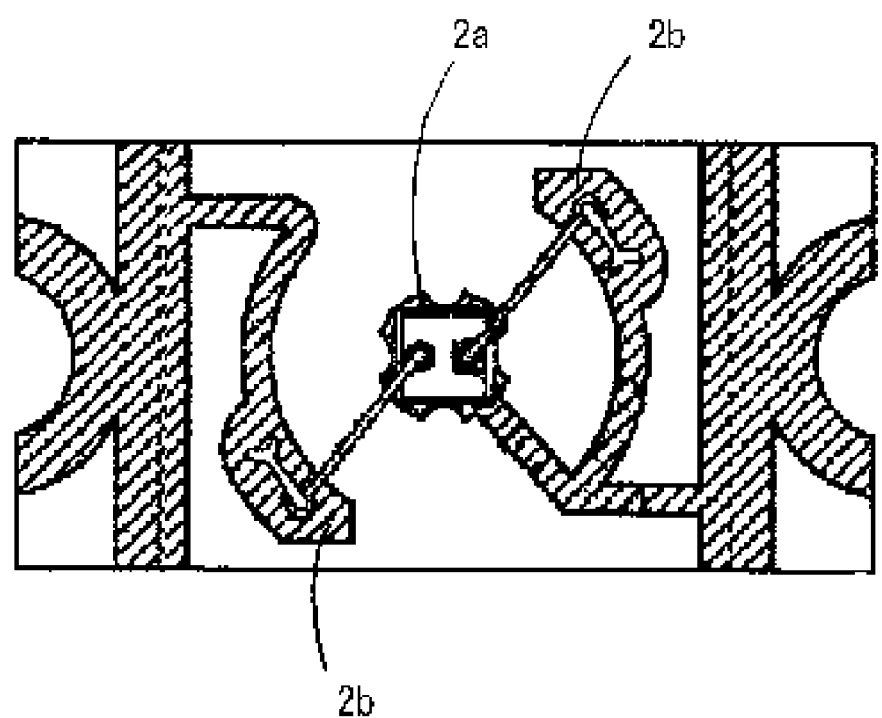
FIG. 4 is a partial top view showing a second exemplary embodiment of a surface mount LED device made in accordance with principles of the disclosed subject matter.

A second exemplary embodiment of the disclosed subject matter will now be described with reference to FIG. 4. FIG. 4 shows a substantial part of a surface mount LED device made in accordance with the second exemplary embodiment of the disclosed subject matter, and the substantial part corresponds to that of the first exemplary embodiment shown in FIG. 2.

The embodiment of the surface mount LED device shown in FIG. 4 is similar to that of the embodiment shown in FIG. 2 in basic structure but differs in the type of LED chip 3. That is, the LED chip 3 of the second exemplary embodiment can be substantially cubic, yet it can provide a pair of electrodes on the top surfaces thereof without an electrode on the bottom surface thereof.

Therefore, the pair of electrodes on the top surface can be electrically connected to a pair of wire bonding pads 2b of the conductor patterns 2 via bonding wires 5 that can be composed of gold (Au) wires. The adhesive material 4 does not necessarily include a conductive material, but can be a thermosetting resin such as an epoxy resin and the like. Thus, the adhesive material 4 can be easy to treat because a short circuit between the pair of wire bonding pad 2b may not be caused thereby.

Figure 5:
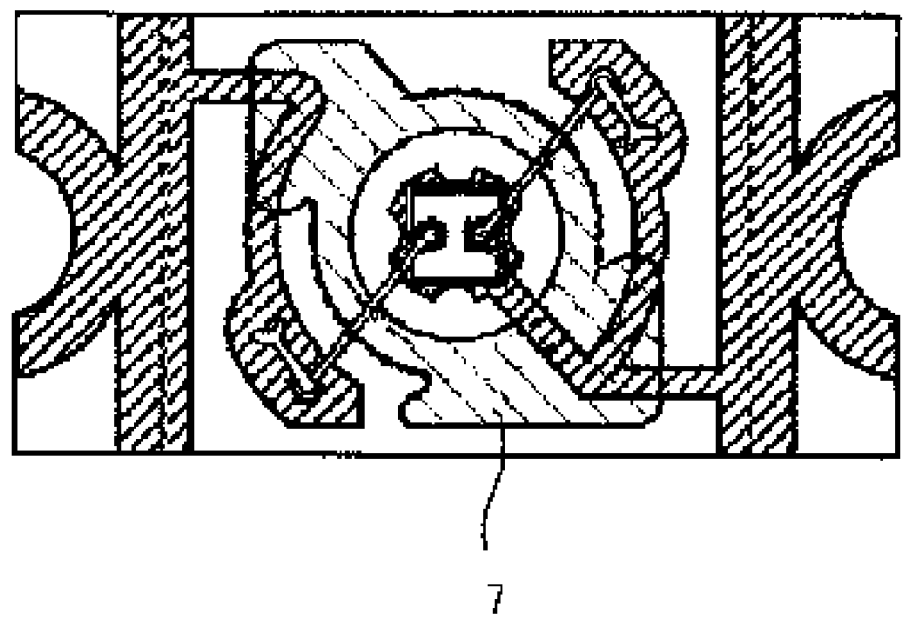
FIG. 5 is a partial top view showing a third exemplary embodiment of a surface mount LED device made in accordance with principles of the disclosed subject matter.
Figure 6:
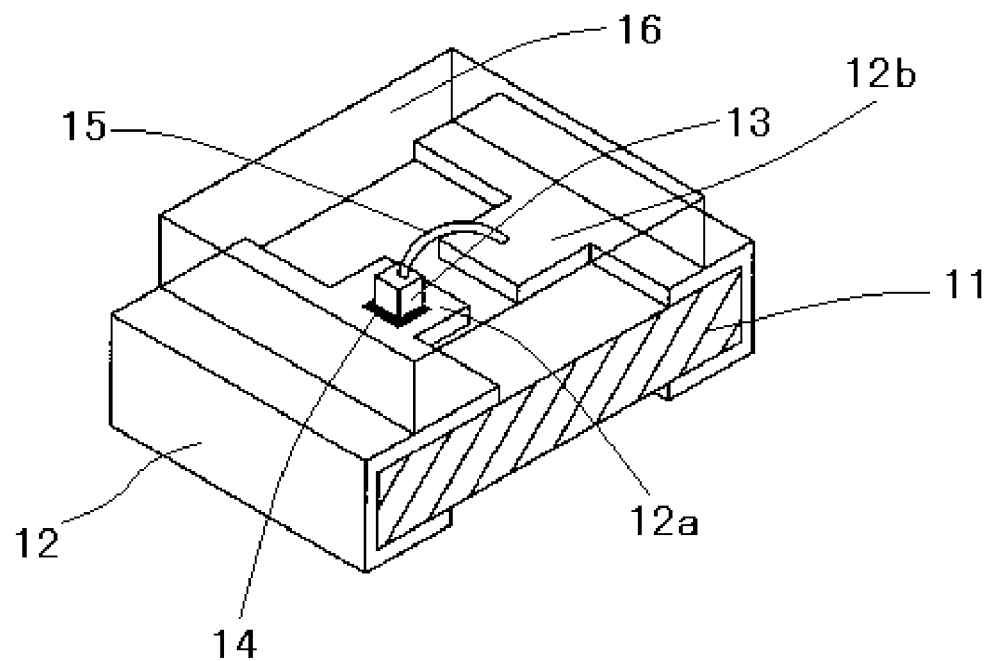
FIG. 6 is a perspective view depicting a conventional surface mount LED device.

A third exemplary embodiment of the disclosed subject matter will now be described with reference to FIG. 5. FIG. 5 shows a substantial part of a surface mount LED device made in accordance with the third exemplary embodiment. The substantial part corresponds to that of the second exemplary embodiment shown in FIG. 4.

The embodiment of the surface mount LED device shown in FIG. 5 is similar to that of the embodiment shown in FIG. 4 in basic structure but differs in that it includes an overcoat 7 therein. That is to say, in the third exemplary embodiment of the disclosed subject matter, an overcoat 7 can be formed on the circuit board and configured so as to enclose both the die bonding pad 2a and the plurality of cutout sections 21a as shown in FIG. 5.

The overcoat 7 can be formed, for instance, by a screen printing process using a thermosetting epoxy resin. Because the overcoat 7 can stop an outward flow of the adhesive material 4, the overcoat 7 can control the adhesive area of the adhesive material 4 with both the die bonding pad 2a and the insulating board 1 exposed in the plurality of cutout sections 21a and to adjust a quantity thereof.

When the overcoat 7 does not exist, the adhesive material 4 itself controls the quantity thereof so as not to extend towards the wire bonding pad 2b. Therefore, the adhesive material 4 may tend to become small in quantity in order not to reach the wire bonding pad 2b, and also may be difficult to employ a low-viscosity material because it can easily extend towards the wire bonding pad 2b when the overcoat 7 does not exist.

However, when the overcoat 7 exists, the overcoat 7 can result in increasing the possible condition qualities that can be used to select the adhesive material 4, such as quantity, viscosity and the like because the overcoat 7 can function to stop the outward flow of the adhesive material 4. Especially, when the overcoat 7 is used in the above-described first exemplary embodiment, the overcoat 7 can be useful because the adhesive material 4 should include an electrical conductive material. If the adhesive material 4 extends to the wire bonding pad 2b in this exemplary embodiment, the adhesive material 4 may cause a short circuit problem between both electrodes of the electric component.

Thus, the surface mount device of the third exemplary embodiment can improve the fixing intensity between the electronic component and the circuit board by using a favorable quantity of the adhesive material 4 by determining a shape of overcoat 7 according to the surface mount device. Furthermore, if the device the first exemplary embodiment includes the overcoat 7, the device could avoid the short circuit problem caused by touching the wire bonding pad 2b with the adhesive material 4 when the material 4 includes the conductive material.

Results of the above-described exemplary embodiments will now be given with respect to a conventional surface mount LED device that does not include the cutout sections 22a. When the conventional surface mount LED devices are mounted on a mounting board at temperatures of approximately 260 degrees centigrade in a reflow soldering process, the incidence of defects of the surface mount LED devices in which the devices cannot emit light due to peeling of the LED chip from the die bonding pad 2a is between 2 and 3 parts per million.

On the other hand, the defect rate in the first, second and third exemplary embodiments under the above-described same conditions is substantially zero.

In the above-described embodiments, LED chips 3 which are used as light-emitting devices are mounted on the circuit board. However, it is possible to mount photodiode chips, phototransistor chips, etc., that can be used as light detecting devices. In addition, other light-emitting devices such as laser diodes, etc., and other types of semiconductor chips in general can be used in place of the LED chip 3 described above for use as the electronic component without departing from the spirit and scope of the presently disclosed subject matter.

While there has been described what are at present considered to be exemplary embodiments of the invention, it will be understood that various modifications may be made thereto, and it is intended that the appended claims cover such modifications as fall within the true spirit and scope of the invention. All conventional art references described above are herein incorporated in their entirety by reference.

What is claimed is:

1. A surface mount electronic device comprising:
   a circuit board including at least one conductor pattern located adjacent an insulating board, the conductor pattern including both a die bonding pad and at least one wire bonding pad that extend to respective electrodes for receiving power supply, the die bonding pad having both a center and a circumference, and the die bonding pad including a plurality of cutout sections that expose the insulating board and extend towards the center of the circumference; and
   an electronic component having both a bottom surface and a center of the bottom surface and being mounted on the die bonding pad with an adhesive material, and further including electrodes that are electrically connected to each respective electrode of the conductor pattern through at least one of the die bonding pad via the adhesive material and the at least one wire bonding pad via at least one bonding wire, wherein the plurality of cutout sections is not formed underneath the bottom surface of the electronic component, and the adhesive material contacts a portion of the insulating board exposed in the plurality of cutout sections located out of range of the bottom surface of the electronic component mounted on the die bonding pad.

2. The surface mount electronic device according to claim 1, wherein the cutout sections are substantially symmetrical with respect to a line intersecting the center of the die bonding pad.

3. The surface mount electronic device according to claim 1, wherein the cutout sections are substantially symmetrical with respect to a line intersecting at a right angle with a side of the electronic component and intersecting the center of the bottom surface of the electronic component.

4. The surface mount electronic device according to claim 2, wherein the cutout sections are substantially symmetrical with respect to a line intersecting at a right angle with a side of the electronic component and intersecting the center of the bottom surface of the electronic component.

5. The surface mount electronic device according to claim 1, further comprising:
an overcoat configured to enclose both the die bonding pad and the plurality of cutout sections on the circuit board.

6. The surface mount electronic device according to claim 2, further comprising:
an overcoat configured to enclose both the die bonding pad and the plurality of cutout sections on the circuit board.

7. The surface mount electronic device according to claim 3, further comprising:
an overcoat configured to enclose both the die bonding pad and the plurality of cutout sections on the circuit board.

8. The surface mount electronic device according to claim 4, further comprising:
an overcoat configured to enclose both the die bonding pad and the plurality of cutout sections on the circuit board.

9. The surface mount electronic device according to claim 1, further comprising:
an encapsulating resin located so as to encapsulate the electronic component on the circuit board.

10. The surface mount electronic device according to claim 2, further comprising:
an encapsulating resin located so as to encapsulate the electronic component on the circuit board.

11. The surface mount electronic device according to claim 3, further comprising:
an encapsulating resin located so as to encapsulate the electronic component on the circuit board.

12. The surface mount electronic device according to claim 5, further comprising:
an encapsulating resin located so as to encapsulate the electronic component on the circuit board.

13. A surface mount electronic device comprising:
a circuit board including at least one conductor pattern located adjacent an insulating board, the conductor pattern including both a die bonding pad and at least one wire bonding pad that each extend to a respective electrode for receiving a power supply, the die bonding pad having both a center and an outer peripheral circumference as viewed from a top view, and the die bonding pad including a plurality of cutout sections that expose the insulating board and extend towards the center from the circumference and are located substantially symmetrically with respect to two lines intersecting at a right angle to each other at the center of the die bonding pad as viewed from the top view; and a light-emitting component being substantially cubic or rectangular parallelepiped and having a bottom surface and a center of the bottom surface, the bottom surface of the light-emitting component being mounted on the die bonding pad via an adhesive material, the center of the bottom surface substantially corresponding to the center of the die bonding pad, the bottom surface including at least one side intersecting at a right angle with one of the two lines and being parallel to the other of the two lines, and the light emitting component including electrodes each electrically connected to a respective electrode of the conductor pattern through at least one of the die bonding pad via the adhesive material and the at least one wire bonding pad via at least one bonding wire, wherein the plurality of cutout sections is not formed underneath the bottom surface of the light-emitting component, and the adhesive material contacts the plurality of cutout sections at portions located out of range of the bottom surface of the light-emitting component.

14. The surface mount electronic device according to claim 13, wherein each of the insulating board and the adhesive material is configured of a material based on an epoxy resin.

15. The surface mount electronic device according to claim 13, further comprising:
an overcoat configured to enclose both the die bonding pad and the plurality of cutout sections on the circuit board.

16. The surface mount electronic device according to claim 14, further comprising:
an overcoat configured to enclose both the die bonding pad and the plurality of cutout sections on the circuit board.

17. The surface mount electronic device according to claim 13, further comprising:
an encapsulating resin configured to encapsulate the light-emitting component on the circuit board.

18. The surface mount electronic device according to claim 14, further comprising:
an encapsulating resin configured to encapsulate the light-emitting component on the circuit board.

19. The surface mount electronic device according to claim 15, further comprising:
an encapsulating resin configured to encapsulate the light-emitting component on the circuit board.

20. The surface mount electronic device according to claim 16, further comprising:
an encapsulating resin configured to encapsulate the light-emitting component on the circuit board.

21. The surface mount electronic device according to claim 13, wherein the insulating board is made from a resin material and the adhesive is a resin adhesive.

22. The surface mount electronic device according to claim 1, wherein the insulating board is made from a resin material and the adhesive is a resin adhesive.

23. A surface mount electronic device comprising:
a circuit board including at least one conductor pattern located adjacent an insulating board, the conductor pattern including a die bonding pad and a die bonding electrode extending from the die bonding pad, and a wire bonding pad and a wire bonding electrode extending from the wire bonding pad, the die bonding pad having a center as viewed from a top view and including at least three flanges that extend outward from the center and are separated by indents as viewed from the top view; and an electronic component mounted on the die bonding pad with an adhesive material and including electrodes that are electrically connected to each respective electrode of the conductor pattern through at least one of the die bonding pad via the adhesive material and the wire bonding pad via at least one bonding wire, wherein the indents are not formed underneath a bottom surface of the electronic component, and the adhesive material contacts a portion of the insulating board exposed in the indents as viewed from the top view.

* * * * *